United States Patent [19]

Caldwell et al.

[11] Patent Number: 4,580,107

[45] Date of Patent: Apr. 1, 1986

[54] PHASE LOCK ACQUISITION SYSTEM HAVING FLL FOR COARSE TUNING AND PLL FOR FINE TUNING

[75] Inventors: Stephen P. Caldwell, Linthicum; Martin J. Decker, Baltimore; Robert A. Jelen, Severna Park, all of Md.

[73] Assignee: The United States of America as represented by the Secretary of the Air Force, Washington, D.C.

[21] Appl. No.: 617,668

[22] Filed: Jun. 6, 1984

[51] Int. Cl.⁴ .......................... H03L 7/06; H03L 7/10
[52] U.S. Cl. ...................................... 331/10; 331/11; 331/12; 331/14; 331/16; 331/17
[58] Field of Search ....................... 331/10, 11, 12, 14, 331/16, 17

[56] References Cited

U.S. PATENT DOCUMENTS

| 3,346,814 | 10/1967 | Haggai | 329/122 |
|---|---|---|---|
| 3,421,105 | 1/1969 | Taylor | 331/4 |
| 3,795,870 | 3/1974 | Sanders | 331/1 A |
| 3,825,855 | 7/1974 | Basset et al. | 331/11 X |
| 3,859,599 | 1/1975 | Peil | 325/419 |
| 4,272,729 | 6/1981 | Riley, Jr. | 331/11 X |
| 4,354,277 | 10/1982 | Crackel et al. | 455/259 |
| 4,365,211 | 12/1982 | Lee | 331/11 |
| 4,374,438 | 2/1983 | Crowley | 455/265 |
| 4,409,563 | 10/1983 | Vandegraaf | 331/11 |
| 4,423,390 | 12/1983 | Waters | 331/14 X |
| 4,434,407 | 2/1984 | Healey, III et al. | 331/10 X |
| 4,511,858 | 4/1985 | Charavit et al. | 331/10 |

FOREIGN PATENT DOCUMENTS 0799016 11/1968 Canada ................................ 331/11

Primary Examiner—Eugene R. LaRoche
Assistant Examiner—D. C. Mis
Attorney, Agent, or Firm—Donald J. Singer; Willard R. Matthews

[57] ABSTRACT

The acquisition of phase lock to a reference frequency by a signal acquisition system is accomplished using a voltage controlled oscillator, a wideband frequency discriminator, a prepositioning circuit, and a phase lock loop. The voltage controlled oscillator is prepositioned within a loop bandwidth of the reference frequency by the prepositioning circuit and the wide band frequency discriminator which provide coarse tuning. The voltage controlled oscillator achieves phase lock with the reference frequency when it receives the fine tune signal from the phase lock loop. Using both the discriminator and the phase lock loop allows fast acquisition without the need to calibrate the voltage controlled oscillator. Since the discriminator pull-in range is much larger than the phase-lock loop bandwidth, the number of bits can be much smaller than in an acquisition circuit using a digital prepositioning circuit alone.

6 Claims, 5 Drawing Figures

COARSE-TUNE VOLTAGE DURING ACQUISITION USING SECOND DISCLOSED TECHNIQUE

PHASE DETECTOR OUTPUT DURING ACQUISITION

COARSE-TUNE VOLTAGE DURING ACQUISITION USING TECHNIQUE WITH DISCRIMINATION ONLY

PHASE LOCK ACQUISITION SYSTEM HAVING FLL FOR COARSE TUNING AND PLL FOR FINE TUNING

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to signal acquisition systems using phase-locked loops as tracking filters, and specifically to a system for acquiring phase lock from large frequency errors using digital and analog circuitry to provide fast acquisition without the need of calibrating the voltage controlled oscillator.

Modern signal acquisition systems use phase-locked loops as tracking filters. A practical problem of these loops is the acquisition of phase lock since the phase-lock bandwidth is much less then the tuning range of the voltage controlled oscillator. The problem is compounded when frequency errors occur and the received signal is not at the expected frequency or varies with time.

In both radar and communications, a variety of causes can account for the frequency errors of returned signals. For example, frequency shifts can be caused by the Doppler effect depending upon the relative velocities of the receiver and the signal source. Background noise or changes in the frequency characteristics of crystal oscillators can account for other sources of frequency error.

The task of acquiring a received signal and staying "locked on" to that signal has been alleviated to some degree by the prior art techniques given by the following patents: U.S. Pat. No. 4,354,277 issued to Crackel et al on Oct. 12, 1982; U.S. Pat. No. 4,374,438 issued to Crowley on Feb. 15, 1983; U.S. Pat. No. 3,859,599 issued to Peil on Jan. 7, 1975; U.S. Pat. No. 3,795,870 issued to Sanders on Mar. 5, 1974; U.S. Pat. No. 3,346,814 issued to Haggai on Oct. 10, 1967; and U.S. Pat. No. 3,421,105 issued to Taylor on Jan. 7, 1969.

All of the above disclosures involve the use of phase-lock loops working in combination with a voltage controlled oscillator. For example, Crackel et al disclose a frequency tracking feedback circuit for acquiring a communication carrier signal from a relatively noisy environment. The patented circuit includes a digital phase-frequency detector, a limiter, a mixer, and a voltage controlled oscillator connected in a control loop. Included in the patent is an arrangement for detecting when the desired signal has been acquired, so that control may be switched from the frequency tracking loop of the patent to another control system, such as a conventional phase-locked loop.

The approach in Crackel et al is typical in the techniques disclosed in the other prior art, which may be summarized as follows:

A digital frequency and phase lock loop is taught by Crowley. In Peil a phase/frequency control network permits the combination of a large capture bandwidth with accurate narrow band turning after "lock in". Sanders uses a frequency-phase detector in a phase lock loop system to speed up loop lock. This is accomplished in the patent by enabling a variable high gain amplifier during off lock to substantially increase the output level of the phase detector to the VCO tuning circuitry. Haggai discloses dual loop control and Taylor operates a frequency tracking system in both an acquisition mode and a tracking mode.

All the cited prior art techniques quite properly emphasize the use of phase lock loops in combination with a voltage controlled oscillator to acquire and stay "locked-on" the reference frequency of an incoming signal. However, the dependance of these techniques on a phase lock loop retains a technical difficulty: generally, the bandwidth of phase-lock loop is always much less than the tuning range of the voltage controlled oscillator.

One solution to the technical problem is the calibration of the tuning curve of the voltage controlled oscillator. After a calibration, the VCO can always be positioned within a loop bandwidth of the reference frequency which ensures phase-lock. This technique gives fastest possible acquisition. A distinct disadvantage of the technique is that the circuitry required for calibration can be as complex as the loop. Also, dedicated system time is required for calibration. For this reason the calibration solution is less than satisfactory.

In view of the foregoing discussion it is apparent that there currently exists the need for a system for acquiring phase lock with small acquisition times depending upon frequency errors and loop bandwidths. The present invention is directed towards satisfying that need.

SUMMARY OF THE INVENTION

This invention is an arrangement for acquiring phase lock from large frequency errors which uses digital and analog circuitry in combination to provide moderately fast acquisition without need for calibrating the voltage controlled oscillator (VCO). It comprises a phase locked loop used as a tracking filter. The filter employs a wide-band frequency discriminator and digital pre-positioning circuit to acquire phase-lock. For digital control the number of bits is chosen to provide sufficient VCO tuning resolution for positioning the VCO within acquisition range of the wide-band frequency discriminator. Since the discriminator pull-in range is much larger than the phase-locked loop bandwidth, the number of bits can be much smaller than in an acquisition circuit using the digital pre-positioning circuit along. This greatly reduces acquisition time.

It is a prinicipal object of the invention to provide a new and improved means of acquiring phase lock with small acquisition times.

It is another object of the invention to acquire phase lock without requiring a calibration of the voltage controlled oscillator.

These together with other objects features and advantages of the invention will become more readily apparent from the following detailed description when taken in conjunction with the accompanying drawing wherein like elements are given like reference numerals throughout.

DETAILED DESCRIPTION OF THE PREFERRED EMBODIMENT

The invention is a system for rapidly acquiring phase lock from large frequency errors requiring no calibration of the voltage controlled oscillator (VCO).

In combination with a two port voltage controlled oscillator, the system uses a frequency locking circuit to receive the reference frequency and input a frequency discriminator into one port of the VCO to coarse tune the VCO. The system also contains a phase locking circuit which inputs a phase discriminator into the second port of the VCO to fine tune the VCO.

Figure 1:
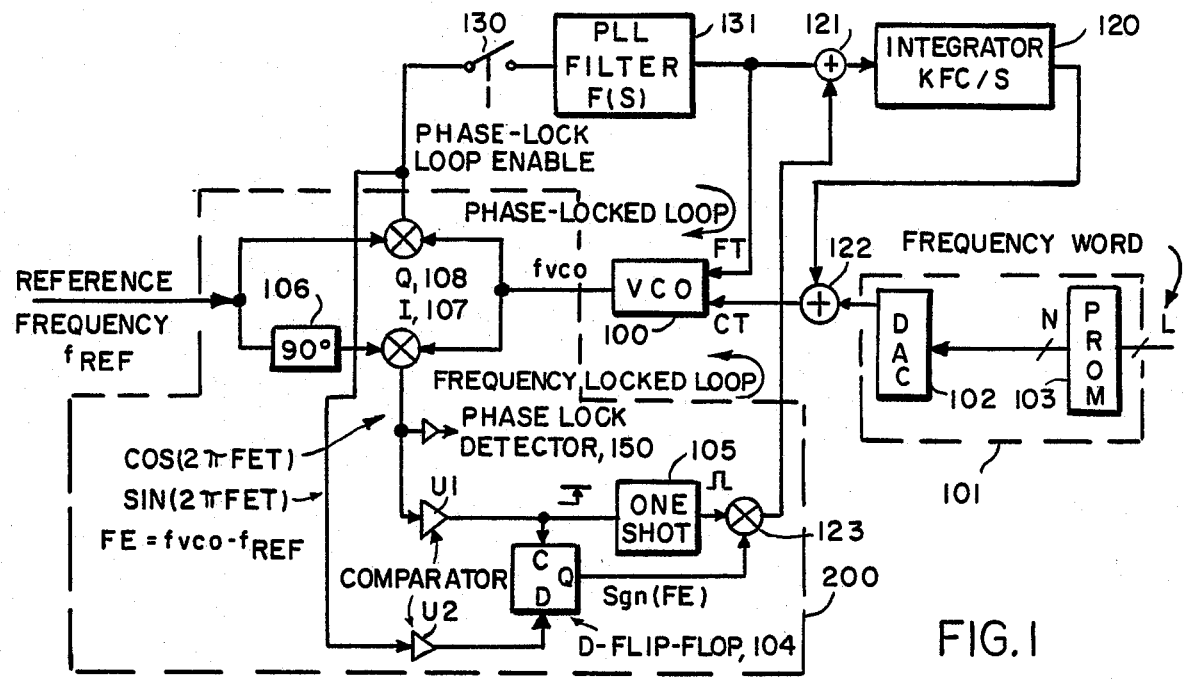
FIG. 1 is a block diagram of an embodiment of the invention.

FIG. 1 is a block diagram of one embodiment of the invention in which a two port voltage controlled oscillator 100 is prepositioned to acquire phase lock by a frequency locking circuit and a phase locking circuit. Coarse tuning of the VCO through the use of the frequency locking circuit which contains: a prepositioned circuit 101, a wideband frequency discriminator 200, an integrator 120, and two adders 121 and 122.

The prepositioning circuit 101 contains a Digital to Analog Converter (DAC) 102, and a Programmable Read Only Memory (PROM) 103. The PROM 103 contains a DAC word of N bits for each frequency the phase-locked loop circuit must lock to. The number of bits is chosen to provide sufficient VCO tuning resolution for positioning the VCO within acquisition range of the wide-band frequency discriminator. Since the discriminator pull-in range is much larger than the phase-locked loop bandwidth, the number of bits can be much smaller than an acquisition circuit which would use a DAC alone. This greatly reduces acquisition time. When the PROM 103 receives a frequency word L identifying a specific frequency, the PROM produces its corresponding DAC word which is converted into an analog signal by the DAC 102.

The wideband frequency discriminator 200 contains: I and Q mixers 107 and 108, comparators U1 and U2, a D flip-flop 104, adder 123, and a one shot multivibrator 105, and phase shifter 106.

The reference frequency $f_{ref}$ is shifted 90° by the phase shifter 106 and this shifted reference frequency as well as the output $f_{VCO}$ of the VCO 100 is input into the I mixer. The I mixer 107 produces an output Cos $(2\pi F_E t)$ where $F_E = f_{VCO} - f_{ref}$ which is sent into comparator U1.

The reference frequency and the VCO output are input into the Q mixer 108. Also input into the Q mixer is output signal $f_{VCO}$ from the VCO 100. The Q mixer produces an output signal of sin $(2\pi F_E t)$ where $F_E = f_{VCO} - f_{ref}$, which is sent into comparator U2.

The outputs of the two comparators U1 and U2 are input into the D flip flop where output signal sign ($F_E$) provides an indication to the discriminator of whether the VCO 100 is above or below the lock frequency.

The output of comparator U1, is also input into the one-shot multivibrator 105. The one-shot 105 output is a narrow pulse whose repetition rate is equal to the period of the error frequency $F_E(t)$.

The output pulse of the one-shot 105 and the output of the D flip-flop 104 are combined by multiplier 123 to produce the output signal of the wideband frequency discriminator. The average voltage of the discriminator output is proportional to the error frequency.

The frequency-locked loop is made then the output of the wideband frequency discriminator, adder 121, the integrator 120 with a gain of $K_{FC}/S$, the VCO 100, and the I and Q mixers 107 and 108. The loop will reduce an initial open loop frequency error $\Delta F$ exponentially with a time constant $1/F_{STEP}$:

$$F_E(t) = \Delta F e^{-tF_{STEP}}. \quad (1)$$

$F_{STEP}$ is the size of the frequency step at the VCO output produced by the integrated output of one pulse from the one-shot multivibrator. Since the purpose of the discriminator is to reduce a frequency error within acquisition range of the phase-locked loop, the discriminator step size $F_{STEP}$ should be less than a quarter of a loop bandwidth:

$$F_{STEP} < F_L/4 \quad (2)$$

Combining (1) and (2) gives (3):

$$F_E(t) = \Delta F e^{-t/\tau}, \text{ where } \tau = 4/F_L. \quad (3)$$

This equation shows that frequency acqusition times can be made small with large phase-lock loop bandwidth and/or small frequency errors. As an example, a frequency error would be reduced with a 2μ sec time constant with the discriminator and a 2 MHz phase-locked loop.

A second input into adder 121 is the output of the phase locking circuit which also provides the fine tuning signal into the second port of the VCO 100. The phase locking circuit receives the output signal of the Q mixer when enabled by closing the phase-locked loop enable switch 130. The loop filter 131 filters the voltage signal from mixer Q and sends its output signal to both adder 121 and its fine tune input port of VCO 100.

The transfer between frequency acquisition and phase-lock is accomplished smoothly by integrator $K_{FC}/s$. The output of the integrator is the tuning voltage to the loop VCO. The discriminator output, thru the integrator, tunes the VCO towards the phase-lock loop lock frequency. When the error frequency is within capture range of the phase-locked loop (approximately one loop bandwidth), the phase-lock loop will lock by applying a voltage from mixer Q output thru loop filter F(s) onto the fine tune port of the VCO 100. The frequency-locked loop is disabled when the phase-locked loop locks since the comparator inputs to the discriminator are at DC levels and therefore, the comparators do not trigger. After initial phase-lock thru fine tune, the phase-lock loop applies a voltage thru integrator $K_{FC}/s$ to the coarse-tune port so that the coarse-tune voltage is maintained at its initial phase-lock voltage. This is important since fine-tune voltage is then also maintained at a constant voltage. A constant phase-locked loop bandwidth is then maintained since fine-tune tuning sensitivity is a function of voltage.

As mentioned above, the two inputs into the I mixer are: the VCO signal $f_{VCO}$, and the reference frequency $f_{ref}$. Since the output of the I mixer is Cos $(2\pi F_E t)$ where $F_E = f_{VCO} - f_{ref}$, this output is used by a phase-lock detector 150, which gives an indication to the radar system when the tracking filter obtains phase-lock.

Figure 2:
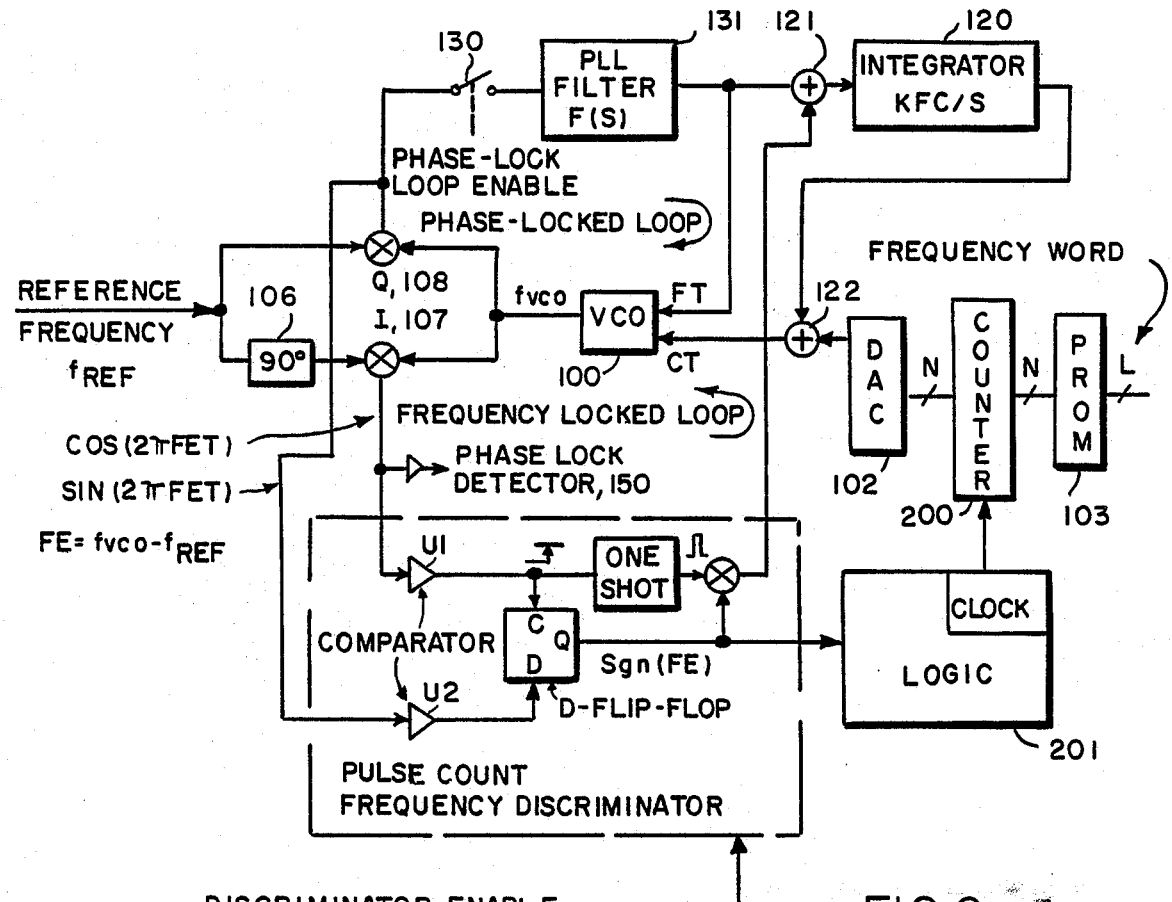
FIG. 2 is a diagram of another embodiment of the invention.

FIG. 2 is a block diagram of another embodiment of the present invention. This embodiment functions as described for FIG. 1, with identical elements having like reference numerals, with the exception of the pre-positioning circuit. The embodiment of FIG. 2 provides an alternate means of pre-positioning the VCO 100. As with the circuit just discussed, acquisition begins by the PROM output and N-bit word corresponding to an L-bit frequency word. However, this N-bit word is loaded into a digital up/down counter 200 before going to the DAC 102. The sense of frequency error (ZFS) received from the D flip-flop by a logic system 201 is used to control the up/down counter so that as it is clocked the frequency error is reduced. The frequency error is thus reduced linearly with time at a rate proportional to the frequency step size and clock frequency. When the frequency error changes its sense, the VCO 100 is within a DAC LSB of the phase-lock frequency, which may be higher than the phase-lock loop acquisition range. The frequency-locked loop is then enabled which reduces the frequency error to within the phase-locked loop acquisition range at which time it locks onto the reference after being enabled by the phase-lock loop enable switch 130.

The main advantage of the acquisition scheme just discussed is digital memory. For example, faster acquisition can be achieved by storing the counter output after it has reduced the frequency error to within a DAC LSB of final value. Then, the next time the frequency is used, a faster acquisition time is ensured.

In the preferred embodiment, an L-Band VCO was locked to a reference in a phase-locked loop with 320 MHz I.F. frequency. The phase-locked loop bandwidth was 1.5 MHz which determined the discriminator step size of 1.5/4 MHz. An 8-bit DAC was used to pre-position the VCO. The LSB of the DAC tuned the VCO 3 MHz nominally and the DAC was clocked by the counter at a 1.25 MHz rate. An initial pre-position error of 20 MHz was programmed into the PROM. Tests of the discriminator circuitry demonstrated acquisition from 70 MHz.

Figure 3A:
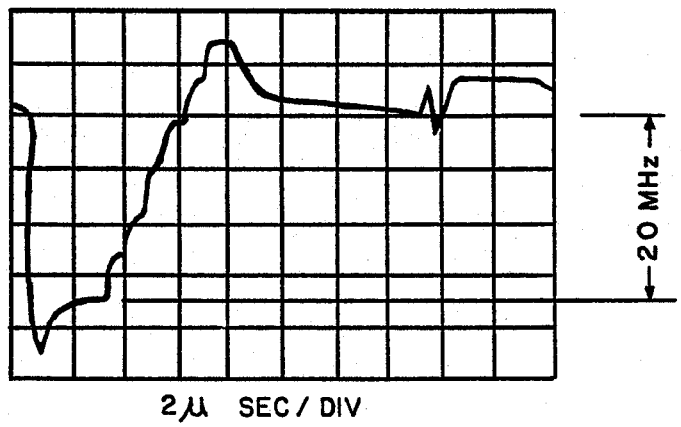
FIG. 3a is a graph of the output waveform of the phase-lock loop coarse-tune voltage during acquisition of the embodiment in FIG. 2.
Figure 3B:
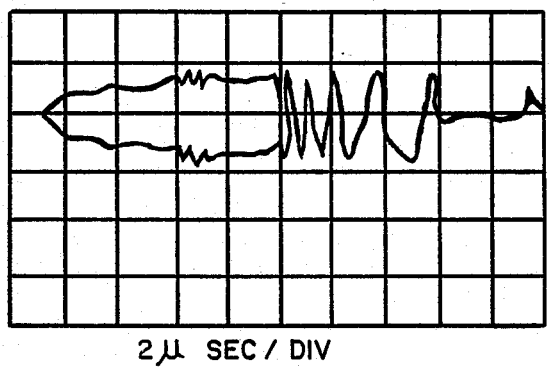
FIG. 3b is a graph of the phase detector output of the embodiment of FIG. 2.

FIG. 3a shows the output waveform of the phase-lock loop coarse-tune voltage during acquisition using the second disclosed technique. The coarse-tune waveform shows the coarse-tune voltage being stepped toward a voltage where the VCO will phase-lock. Upon stepping past the lock point the counter is disabled so the VCO will not be stepped. The frequency-locked loop is enabled and reduces the residual frequency error to within phase-lock loop acquisition range. Note that the exponential decay of coarse-tune voltage during this time has a time constant of $2.7\mu$ sec, which agrees with equation (3). After $8\mu$ sec from enabling the frequency-locked loop, the phase-locked loop is enabled. It then locks as the phase-detector output FIG. 3b illustrates. Note the low frequency beat-note as the coarse-tune voltage is clocked thru the lock point and again later as the discriminator reduces the error frequency to zero. The spike $3\mu$ sec after phase-lock is due to a FET switch which is not a part of the acquisition circuit.

Figure 4:
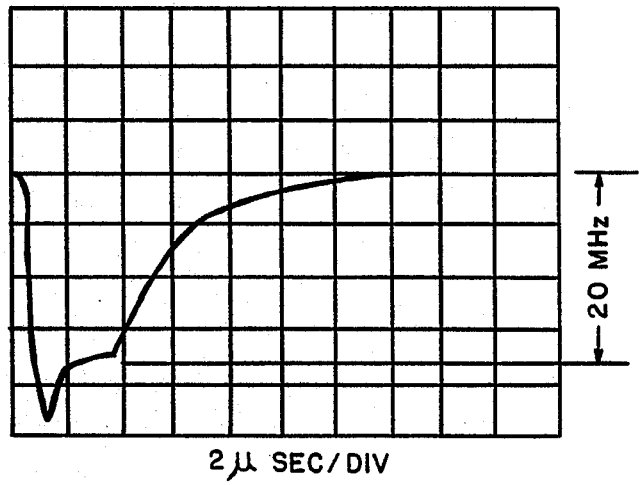
FIG. 4 is a graph of the coarse-tune voltage of the embodiment of FIG. 1.

An acquisition range up to 70 MHz was demonstrated with the embodiment of FIG. 2. This was limited by the AM686 comparators used in the pulse-count frequency discriminator. Also note that using the discriminator alone for acquisition as described in the first technique, acquisition times can be greatly reduced. For example, the 20 MHz pre-position error would be reduced to within a phase-lock loop bandwidth in $6.9\mu$ sec, (FIG. 4), had the first embodiment of FIG. 1 been utilized.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A phase lock acquisition system receiving a reference signal which has a reference frequency and a frequency word from a signal acquisition system and acquiring phase lock by producing an output signal which is synchronized in phase and frequency with the reference signal, said phase lock acquisition system comprising:

a voltage controlled oscillator having first and second inputs and producing said output signal, the first input receiving a positioning signal which coarse tunes the voltage controlled oscillator to produce said output signal to within a loop bandwidth of the reference frequency, the second input receiving a phase discriminator signal to fine tune the voltage controlled oscillator to produce the output signal synchronized in phase and frequency with the reference signal;

a frequency locking circuit receiving said reference signal from said signal acquisition system, said output signal from said voltage controlled oscillator, and said phase discriminator signal, said frequency locking circuit producing a frequency discriminator signal and a first and second error signal, said first and second error signal being a measure of error between the reference frequency of the reference signal and said output signal of said voltage controlled oscillator, said first error signal being given by sin ($2\pi F_E t$), said second error signal being given by cos ($2\pi F_E t$) where $F_E$ is an error frequency equalling the frequency of said output signal of said voltage controlled oscillator minus said reference frequency, said frequency discriminator signal being produced by summing a third error frequency signal which is derived from said first and second error frequency signals with said phase discriminator signal and integrating that sum;

a phase locking circuit receiving said first error signal from said frequency locking circuit and inputting said phase discriminator signal into said second input of said voltage controlled oscillator, said phase discriminator signal providing said fine-tuning to said second input of said voltage controlled oscillator resulting in acquisition of phase lock;

a prepositioning circuit receiving said frequency word from said signal acquisition system and said frequency discriminator signal from said frequency locking circuit, and producing said positioning signal, said positioning signal being received by said voltage controlled oscillator on its first input and positioning said voltage controlled oscillator within a loop bandwidth of the phase locking circuit of said reference frequency; and a phase lock detector receiving said second error signal from said frequency locking circuit and providing indication to said signal acquisition system when phase lock is obtained.

2. A phase lock acquisition system as defined in claim 1 wherein said prepositioning circuit comprises:

a programmable read-only-memory receiving said frequency word from said signal acquisition system and containing a digital-to-analog conversion (DAC) word of N bits for each frequency the phase lock acquisition system must lock to, said programmable read-only-memory producing an output of the DAC word corresponding to the frequency word identified;

a digital-to-analog converter receiving and converting said DAC word from said programmable read-only-memory into an analog signal; and a first adder receiving said analog signal from said digital-to-analog converter and said frequency discriminator signal from said frequency locking circuit and producing said positioning signal.

3. A phase lock acquisition system as defined in claim 2 wherein said frequency locking circuit comprises:

a phase shifter receiving and shifting by 90° said reference frequency from said signal acquisition system;

a wideband frequency discriminator receiving said reference frequency from said signal acquisition system and a shifted reference frequency from said phase shifter, said wideband frequency discriminator receiving said output signal from said voltage controlled oscillator and producing said first and second error signals and an error frequency signal;

a second adder combining said error frequency signal produced by said wideband frequency discriminator with said phase discriminator signal from said phase locking circuit and producing an output signal; and an integrator receiving said output signal from said second adder and producing said frequency discriminator signal.

4. A phase lock acquisition system as defined in claim 3 wherein said wideband frequency discriminator comprises:

first and second mixers, said first mixer receiving said reference frequency from said signal acquisition system and said output signal from said voltage controlled oscillator and producing said first error signal equalling sin $(2\pi F_E t)$ where $F_E$ is an error frequency equalling the frequency of said output signal of said voltage controlled oscillator minus said reference frequency;

said second mixer receiving said shifted reference frequency from said phase shifter and said output signal from said voltage controlled oscillator and producing said second error signal equalling cos $(2\pi F_E t)$;

first and second comparators, said first comparator receiving said first error signal from said first mixer and producing an output signal;

said second comparator receiving said second error signl from said second mixer and producing an output signal;

a D flip-flop receiving said output signals from said first and second comparators and producing an output signal indicating a frequency error sense;

a one-shot multivibrator receiving said output signal from said second comparator and producing a narrow pulse with a repetition rate equalling the period of the error frequency $F_E$ and a multiplier combining said narrow pulse from said one-shot multivibrator with said output signal from said D flip-flop to produce said error frequency signal.

5. A phase lock acquisition system as defined in claim 4 wherein said phase locking circuit comprises:

switch means receiving said first error signal from said first mixer and enabling said phase locking circuit when closed by conducting said first error signal;

filter means filtering the voltage of said first error signal and sending a filtered signal to said second input to said voltage controlled oscillator and to said second adder.

6. A phase lock acquisition system as defined in claim 5 wherein said prepositioning means includes:

logic means receiving said output signal from said D flip-flop indicating said frequency error sense and producing a sense of frequency error output signal;

a counter receiving said DAC word from said programmable read-only-memory, said counter receiving and being controlled by said sense of frequency error output signal from said logic means, said counter producing and sending said DAC word to said digital-to-analog converter.

* * * * *